United States Patent
Xie et al.

(10) Patent No.: US 9,543,073 B2
(45) Date of Patent: Jan. 10, 2017

(54) TRANSFORMER, METHOD FOR MANUFACTURING TRANSFORMER AND CHIP

(71) Applicants: ZTE Corporation, Shenzhen (CN); Sanechips Technology Co., Ltd., Shenzhen (CN)

(72) Inventors: Haolv Xie, Shenzhen (CN); Zhangbin Wu, Shenzhen (CN)

(73) Assignees: ZTE Corporation, Shenzhen, Guangdong (CN); Sanechips Technology Co., Ltd., Shenzhen (CN)

(*) Notice: Subject to any disclaimer, the term of this patent is extended or adjusted under 35 U.S.C. 154(b) by 0 days.

(21) Appl. No.: 15/036,317

(22) PCT Filed: May 13, 2014

(86) PCT No.: PCT/CN2014/077388
§ 371 (c)(1),
(2) Date: May 12, 2016

(87) PCT Pub. No.: WO2014/187254
PCT Pub. Date: Nov. 27, 2014

(65) Prior Publication Data
US 2016/0276098 A1    Sep. 22, 2016

(30) Foreign Application Priority Data
Dec. 19, 2013 (CN) .......................... 2013 1 0704262

(51) Int. Cl.
*H03H 7/42* (2006.01)
*H01F 27/40* (2006.01)
(Continued)

(52) U.S. Cl.
CPC .......... *H01F 27/40* (2013.01); *H01F 27/2823* (2013.01); *H01F 41/06* (2013.01); *H03H 7/42* (2013.01); *H03H 7/0115* (2013.01)

(58) Field of Classification Search
CPC ............. H03H 7/42; H03H 7/422; H03H 5/00
(Continued)

(56) References Cited

U.S. PATENT DOCUMENTS 5,015,972 A * 5/1991 Cygan ...................... H03H 7/38
                                                          333/26
5,477,204 A * 12/1995 Li ....................... H01F 17/0006
                                                         336/200
(Continued)

FOREIGN PATENT DOCUMENTS

CN    202135098 U    2/2012
CN    102543943 A    7/2012
(Continued)

OTHER PUBLICATIONS

International Search Report in international application No. PCT/CN2014/077388 mailed on Sep. 4, 2014.
(Continued)

*Primary Examiner* — Dean Takaoka
(74) *Attorney, Agent, or Firm* — Oppedahl Patent Law Firm LLC (57) ABSTRACT

A transformer, a method for manufacturing the transformer and a chip are provided. The method includes: a first primary tuning capacitor and/or a first secondary tuning capacitor are/is arranged in an area enclosed by a primary coil and a secondary coil, wherein the first primary tuning capacitor includes more than one second primary tuning capacitor, and the first secondary tuning capacitor includes more than one second secondary tuning capacitor; the more than one second primary tuning capacitor are connected in parallel, and the more than one second secondary tuning capacitor are connected in parallel; and the more than one second primary (Continued)

tuning capacitor and the at least one wire between the more than one second primary tuning capacitor, and/or the more than one second secondary tuning capacitor and the at least one wire between the more than one second secondary tuning capacitor form a partially-shielded network or part of the partially-shielded network.

20 Claims, 3 Drawing Sheets (51) Int. Cl.
    *H01F 41/06*     (2016.01)
    *H01F 27/28*     (2006.01)
    *H03H 5/00*     (2006.01)
    *H03H 7/01*     (2006.01)

(58) Field of Classification Search
    USPC .......................................... 333/25, 26, 4, 119
    See application file for complete search history.

(56) References Cited

U.S. PATENT DOCUMENTS

| | | | |
|---|---|---|---|
| 6,603,383 B2 * | 8/2003 | Gevorgian | .......... H01F 17/0013 333/25 |
| 7,808,356 B2 | 10/2010 | Papananos | |
| 8,183,970 B2 | 5/2012 | Papananos | |
| 8,505,193 B2 | 8/2013 | Papananos | |
| 8,552,812 B2 | 10/2013 | Yen | |
| 2002/0113682 A1 | 8/2002 | Gevorgian | |
| 2007/0247269 A1 | 10/2007 | Papananos | |
| 2009/0085705 A1 | 4/2009 | Kim et al. | |
| 2011/0018672 A1 | 1/2011 | Papananos | |
| 2012/0146741 A1 | 6/2012 | Yen | |
| 2012/0223176 A1 | 9/2012 | Papananos | |
| 2013/0300359 A1 | 11/2013 | Nakamura | |
| 2014/0041173 A1 | 2/2014 | Yen et al. | |

FOREIGN PATENT DOCUMENTS

| | | |
|---|---|---|
| CN | 103378394 A | 10/2013 |
| EP | 2671749 A1 | 12/2013 |

OTHER PUBLICATIONS

English Translation of the Written Opinion of the International Search Authority in international application No. PCT/CN2014/077388, mailed on Sep. 2, 2014.

Supplementary European Search Report in European application No. 14801330.3, mailed on Nov. 4, 2016.

\* cited by examiner

TRANSFORMER, METHOD FOR MANUFACTURING TRANSFORMER AND CHIP

TECHNICAL FIELD

The disclosure relates to the receiving and transmitting technology for wireless communication systems, and more particularly to a transformer, a method for manufacturing the transformer, and a chip.

BACKGROUND

A differential circuit has a good immunization against electromagnetic interference, power supply noise and ground noise and has a good performance in suppressing even harmonic, therefore, a circuit of a differential structure becomes more and more popular in a radio-frequency circuit, such as a low-noise amplifier, a frequency mixer and a power amplifier. In an RF communication system, signals sent and received by an antenna are single-ended signals, so that a transformer or a transformer-type balun (balanced to unbalanced), as a module for conversion between a single-end signal and a differential signal, becomes essential in an existing RF circuit system. In a receiver, a transformer converts a single-end signal received by an antenna into a differential signal, and then transmits the differential signal to a low-noise amplifier of a differential structure for amplification; and in a transmitter, a transformer converts a differential signal output by a power amplifier of a differential structure into a single-end signal and then transmits the single-end signal to an antenna for transmission. In consideration of the cost and area of a chip and other aspects, the transformer is usually integrated on a same chip with a receiving/transmitting module.

One of the most important performances of an on-chip transformer, which serves as a passive power transmission module, is insertion loss. When the transformer is located at the front end of a low-noise amplifier of a receiver as a conversion module for a single-end signal and a differential signal, the insertion loss of the transformer is equal to a noise coefficient. If the insertion loss of the transformer is too much, the sensitivity of the whole receiver may be reduced greatly. When the transformer is located at the front end of the transmitter as a conversion module for a differential signal and a single-end signal, the insertion loss of the transformer is equal to the power loss of a transmitted signal. To meet the power requirement of the transmitted signal, the insertion loss is as small as possible.

The insertion loss of the transformer mainly depends on three factors: a coupling coefficient between coils, a quality factor (Q value) of a coil inductor and an input-output return loss, wherein the coupling coefficient can be improved greatly by optimizing the winding way of a transformer coil. For example, the coupling coefficient can be above 0.9 if a laminated structure is adopted; and the input-output return loss can be improved by a tuning capacitor and optimizing the turns ratio of the coil. Under the current process condition, the quality factor of the coil inductor causes the severest impact on the insertion loss of the transformer.

The quality factor of an on-chip coil inductor may be affected by a plurality of factors, one of which is the eddy current loss of the inductor. An eddy current is an induced ring current generated by a magnetic field of the inductor on a conductor, such as the induced ring current on a substrate, a metal wire and a component. Generally speaking, the distance between the conductor and the transformer coil is smaller, the loss of the induced eddy current is more serious. At present, to reduce the influence of the conductor on the self-inductance quality factor of the transformer coil, most of the metal wires and components on the chip keep far away from the coil; thus, the transformer and its surrounding blank area occupy a large area of the chip, and the utilization ratio of the area of the whole chip is very low.

A multi-mode multi-band system is the development trend of the current mobile communication system, transmitting and receiving modules in different frequency bands share one or more antennas, and the transmitting and receiving modules in each frequency band need correspond to one transformer. In consideration of the existing process condition, the cost of the chip and other aspects, the area of the on-chip transformer should not be too large and is usually below 400 um*400 um, so that the self-inductance value of the transformer coil is very small. When the transformer works in a low frequency band range, such as in a frequency band of hundreds of megahertz, its input and output ports need to be connected with a large tuning capacitor in parallel to enable the whole transformer to resonate in a low-frequency working frequency band.

In addition, if the receiving or transmitting module of each frequency band corresponds to one transformer-type balun, the area of the whole chip is very large, accordingly, the cost of the chip is increased greatly. At present, to reduce the number of the transformers on the chip, a common method is to connect a tuning capacitor with the input end and the output end of the transformer in parallel respectively, and a same transformer can work in different frequency bands by changing the value of the tuning capacitor, so as to implement the multiplexing of the same transformer in different frequency bands.

On the whole, the transformer and the tuning capacitor in the multi-mode multi-band system occupy a very large area of the chip, and the Q value of the coil inductor of the transformer is small, so, some measures are needed to be taken to reduce the area of the chip that the transformer and its tuning capacitor occupy and improve the Q value of the coil inductor of the transformer.

SUMMARY

To solve the problems in the related art, embodiments of the disclosure provide a transformer, a method for manufacturing the transformer and a chip, so as to improve the Q value and reduce the structure size of the transformer.

The technical solution of the embodiments of the disclosure is implemented as follows:

A method for manufacturing a transformer is provided, wherein the transformer includes a primary coil, a secondary coil, a first primary tuning capacitor and a first secondary tuning capacitor, and the method includes:

the first primary tuning capacitor and/or the first secondary tuning capacitor are/is arranged in an area enclosed by the primary coil and the secondary coil, wherein the first primary tuning capacitor includes more than one second primary tuning capacitor, and the first secondary tuning capacitor includes more than one second secondary tuning capacitor;

the more than one second primary tuning capacitor are connected in parallel, and the more than one second secondary tuning capacitor are connected in parallel; and the more than one second primary tuning capacitor and at least one wire between the more than one second primary tuning capacitor, and/or the more than one second secondary tuning capacitor and at least one wire between the more than one second primary tuning capacitor form a partially-shielded network or part of the partially-shielded network.

Preferably, the step that the first primary tuning capacitor and/or the first secondary tuning capacitor are/is arranged in an area enclosed by the primary coil and the secondary coil may include:

all or some of the more than one second primary tuning capacitor and/or all or some of the more than one second secondary tuning capacitor are arranged in a blank area enclosed by the primary coil and the secondary coil or under the blank area.

Preferably, the transformer may include an on-chip passive transformer or an on-chip transformer-type balun.

Preferably, capacitances of the more than one second primary tuning capacitor may be completely or incompletely the same;

and/or, capacitances of the more than one second secondary tuning capacitor may be completely or incompletely the same.

Preferably, the method further includes:

the primary coil and the secondary coil may be mutually and symmetrically wound on a same substrate via a metal on a same layer, and an upper-layer metal or a lower-layer metal is adopted for transition in a crossed part of metal wires.

A transformer is provided, including: a primary coil, a secondary coil, a first primary tuning capacitor and a first secondary tuning capacitor, wherein the first primary tuning capacitor includes more than one second primary tuning capacitor which are connected in parallel; and the first secondary tuning capacitor includes more than one second secondary tuning capacitor which are connected in parallel;

the first primary tuning capacitor and/or the first secondary tuning capacitor may be arranged in an area enclosed by the primary coil and the secondary coil; and the more than one second primary tuning capacitor and at least one wire between the more than one second primary tuning capacitor, and/or the more than one second secondary tuning capacitor and at least one wire between the more than one second primary tuning capacitor may form a partially-shielded network or part of a partially-shielded network.

Preferably, the primary coil and the secondary coil may be mutually and symmetrically wound on a same substrate via the metal on the same layer, and an upper-layer metal or a lower-layer metal may be adopted for transition in a crossed part of metal wires.

Preferably, all or some of the more than one second primary tuning capacitor and/or all or some of the more than one second secondary tuning capacitor may be arranged in a blank area enclosed by the primary coil and the secondary coil or under the blank area.

Preferably, capacitances of the more than one second primary tuning capacitor may be completely or incompletely the same;

and/or, capacitances of the more than one second secondary tuning capacitor may be completely or incompletely the same.

A chip is provided, including any one of the transformers.

According to the transformer, the method for manufacturing the transformer, and the chip provided by the embodiments of the disclosure, the transformer includes a primary coil, a secondary coil, a first primary tuning capacitor and a first secondary tuning capacitor; firstly, the first primary tuning capacitor and/or the first secondary tuning capacitor are/is arranged in an area enclosed by the primary coil and the secondary coil, wherein the first primary tuning capacitor includes more than one second primary tuning capacitor, and the first secondary tuning capacitor includes more than one second secondary tuning capacitor; secondly, the more than one second primary tuning capacitor are connected in parallel, and the more than one second secondary tuning capacitor are connected in parallel; and finally, the more than one second primary tuning capacitor and their wires, and/or the more than one second secondary tuning capacitor and their wires form a partially-shielded network or part of the partially-shielded network; thus, the transformer can have a high Q value and a small structural size.

BRIEF DESCRIPTION OF THE DRAWINGS

FIG. 3-1 is a diagram showing a structure of a four-port transformer circuit having a turns ratio of 1:2 in the related arts;

FIG. 3-2 is a diagram showing a layout implementation structure of FIG. 3-1 in an embodiment of the disclosure;

FIG. 4-1 is a diagram showing a structure of a four-port frequency-adjustable transformer-type balun circuit having a turns ratio of 1:2 in the related arts;

FIG. 4-2 is a diagram showing a layout implementation structure of FIG. 4-1 in an embodiment of the disclosure; and FIG. 4-3 is a diagram showing a network structure of interconnected metal wires after a tuning capacitor is removed from a partially-shielded network in FIG. 4-2.

DETAILED DESCRIPTION

Figure 1:
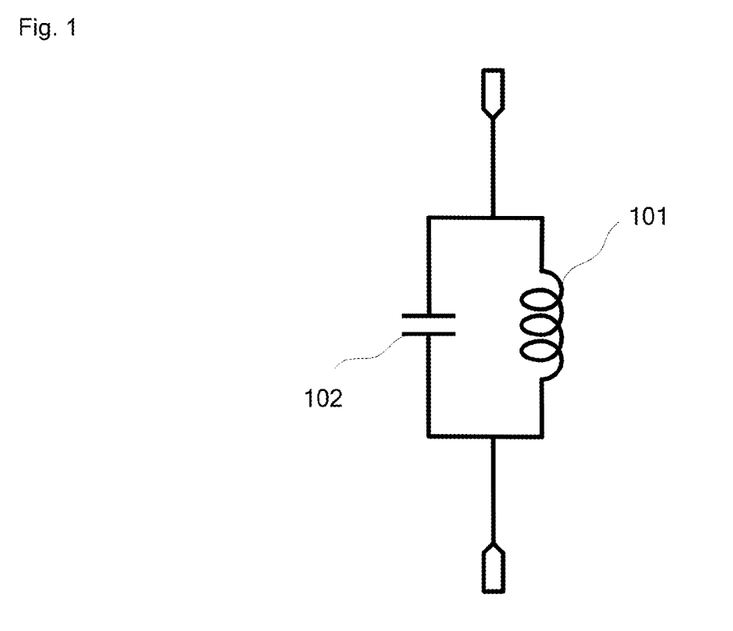
FIG. 1 is a diagram showing a structure of an LC resonant circuit in the related arts.

An embodiment of the disclosure provides a transformer, a method for manufacturing the transformer, and a chip, in order to improve the Q value of the transformer based on the structure of an LC resonance circuit of the transformer, wherein the LC resonance circuit is as shown in FIG. 1, and is formed by connecting an inductor 101 and a capacitor 102 in parallel. According to an electromagnetic induction phenomenon, when a conductor is in a variable magnetic field, the conductor may generate an induced eddy current. The loss generated by the eddy current is in a direct proportion to the area of the conductor vertical to a magnetic line of force, namely, the smaller the area of the conductor is, the smaller the loss of the induced eddy current generated in the electromagnetic field is. In other words, if a large conductor is divided into N parts, the total eddy current loss of the divided conductor is 1/N of the total eddy current loss of the conductor which is not yet divided.

Thus, an embodiment of the disclosure provides a method for manufacturing the transformer, including: first tuning capacitors, which are integrated on a same substrate, in the LC resonant structure of the transformer are replaced with a plurality of second tuning capacitors with smaller areas, then, these second tuning capacitors are placed in a central blank area enclosed by a primary coil and a secondary coil or under the blank area, and the second tuning capacitors and their wires form a partially-shielded network or part of the partially-shielded network. The first tuning capacitor includes a first primary tuning capacitor and a first secondary tuning capacitor; correspondingly, each second tuning capacitor includes a second primary tuning capacitor and a second secondary tuning capacitor, the first primary tuning capacitor and the primary coil form an LC resonance circuit, and the first secondary tuning capacitor and the secondary coil form an LC resonance circuit. Thus, the Q value of the transformer is improved. The eddy current loss of the shielded network is very small, and the eddy current loss of the substrate can be reduced, so that the aims of improving the Q value of the inductor and reducing the area of an LC resonant network can be achieved.

The technical solution of the disclosure is further explained below in combination with the drawings and the embodiments in detail.

Figure 2:
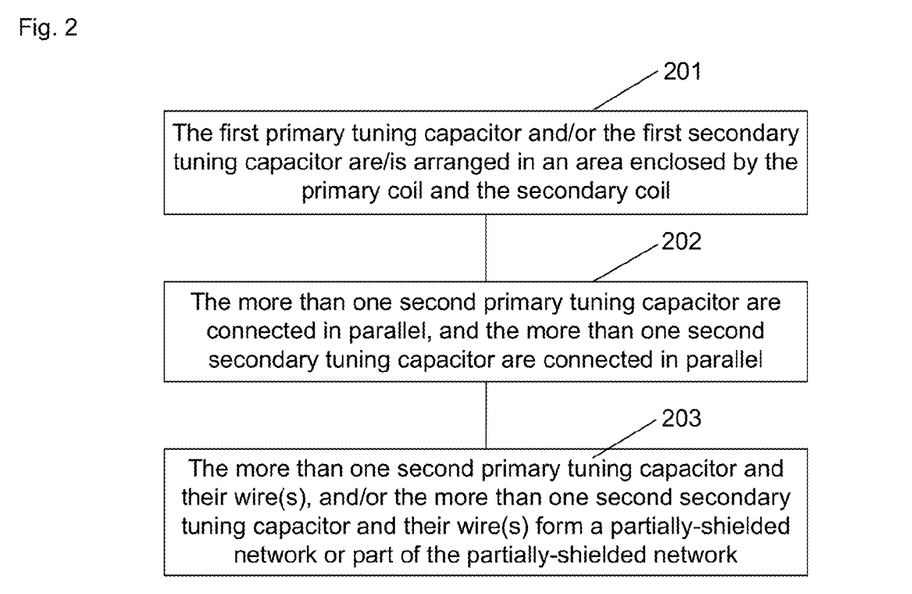
FIG. 2 is a diagram showing an implementation flow of a method for manufacturing a transformer in an embodiment of the disclosure.

FIG. 2 is a diagram showing the implementation flow of a method for manufacturing a transformer in an embodiment of the disclosure. The transformer includes a primary coil, a secondary coil, a first primary tuning capacitor and a first secondary tuning capacitor. As shown in FIG. 2, the method for manufacturing the transformer includes:

Step 201: The first primary tuning capacitor and/or the first secondary tuning capacitor are/is arranged in an area enclosed by the primary coil and the secondary coil.

Here, the first primary tuning capacitor includes more than one second primary tuning capacitor, and the first secondary tuning capacitor includes more than one second secondary tuning capacitor.

Here, the first primary tuning capacitor and the primary coil form an LC resonance circuit, and the first secondary tuning capacitor and the secondary coil form an LC resonance circuit.

The step that the first primary tuning capacitor and/or the first secondary tuning capacitor are/is arranged in an area enclosed by the primary coil and the secondary coil may include: all or some of the more than one second primary tuning capacitor and/or the more than one second secondary tuning capacitor are arranged in a blank area enclosed by the primary coil and the secondary coil or under the blank area.

Specifically, all or some of the more than one second primary tuning capacitor are arranged in a blank area enclosed by the primary coil and the secondary coil or under the blank area;

all or some of the more than one second secondary tuning capacitor are arranged in a blank area enclosed by the primary coil and the secondary coil or under the blank area; and all or some of the more than one second primary tuning capacitor and/or the more than one second secondary tuning capacitor are arranged in a blank area enclosed by the primary coil and the secondary coil or under the blank area.

Step 202: The more than one second primary tuning capacitor are connected in parallel, and the more than one second secondary tuning capacitor are connected in parallel.

Step 203: The more than one second primary tuning capacitor and the wire(s) between the more than one second primary tuning capacitor, and/or the more than one second secondary tuning capacitor and their wire(s) form a partially-shielded network or part of the partially-shielded network.

Generally, for an on-chip coil inductor, the transformer and a balun, the eddy current loss of the substrate is one of factors restricting the Q value of the coil inductor. In order to reduce the influence of the eddy current loss of the substrate on the Q value of the coil inductor, the most common method is to place a strip-shaped shielding layer with a large resistivity between the coil and the substrate. In the embodiment, the partially-shielded network indicates that a shielded layer does not cover the bottom of the whole coil but is placed only under the central blank area of the coil. In the embodiment, the benefit of the partially-shielded network lies in that parasitic capacitance between the coil and the shielded layer can be reduced to a large extent, so that the Q value of the coil and self-resonant frequency can be improved greatly, wherein the coil includes a primary coil and a secondary coil. Those skilled in that art can implement the partially-shielded network in the embodiment according to various conventional arts, thereby needing no further description.

In the embodiment, the capacitances of the more than one second primary tuning capacitor can be completely or incompletely the same; and/or, the capacitances of the more than one second secondary tuning capacitor can be completely or incompletely the same. In the specific implementation process, the magnitude of the capacitance of the capacitor can be represented by an area size, so that the areas of the more than one second primary tuning capacitor and/or the more than one second secondary tuning capacitor can be completely or incompletely the same.

In the embodiment, the method further includes: the primary coil and the secondary coil are mutually and symmetrically wound on a same substrate via the metal on the same layer, and an upper-layer metal or a lower-layer metal is adopted for transition in the crossed part of the metal wires.

The method for manufacturing the transformer provided by the embodiment of the disclosure can be applied to any on-chip passive transformer with a tuning capacitor without any limit and can also be applied to any on-chip transformer-type balun with a tuning capacitor. Here, the on-chip passive transformer and the transformer-type balun can be in any shape and structure, and only if there is a central blank area enclosed by the primary coil and the secondary coil, the shielded network of the tuning capacitor can be placed in the blank area or under the blank area.

Based on the method for manufacturing the transformer, an embodiment of the disclosure further provides a transformer, which includes: a primary coil, a secondary coil, a first primary tuning capacitor and a first secondary tuning capacitor, wherein the first primary tuning capacitor includes more than one second primary tuning capacitor which are connected in parallel; and the first secondary tuning capacitor includes more than one second secondary tuning capacitor which are connected in parallel;

the first primary tuning capacitor and/or the first secondary tuning capacitor are/is arranged in an area enclosed by the primary coil and the secondary coil; and the more than one second primary tuning capacitor and their wires, and/or the more than one second secondary tuning capacitor and their wires form a partially-shielded network or part of a partially-shielded network.

Here, the primary coil and the secondary coil are mutually and symmetrically wound on a same substrate via the metal on the same layer, and an upper-layer metal or a lower-layer metal is adopted for transition in the crossed part of the metal wires.

Here, the step that the first primary tuning capacitor and/or the first secondary tuning capacitor are/is arranged in an area enclosed by the primary coil and the secondary coil may include: all or some of the second primary tuning capacitors and/or all or some of the second secondary tuning capacitors are arranged in a blank area enclosed by the primary coil and the secondary coil or under the blank area.

Here, the capacitances of the more than one second primary tuning capacitor can be completely or incompletely the same; and/or, the capacitances of the more than one second secondary tuning capacitor can be completely or incompletely the same.

Based on the transformer, an embodiment of the disclosure provides a chip, which includes the transformer which is manufactured by the method for manufacturing the transformer in FIG. 2.

First Embodiment

Figure 31:
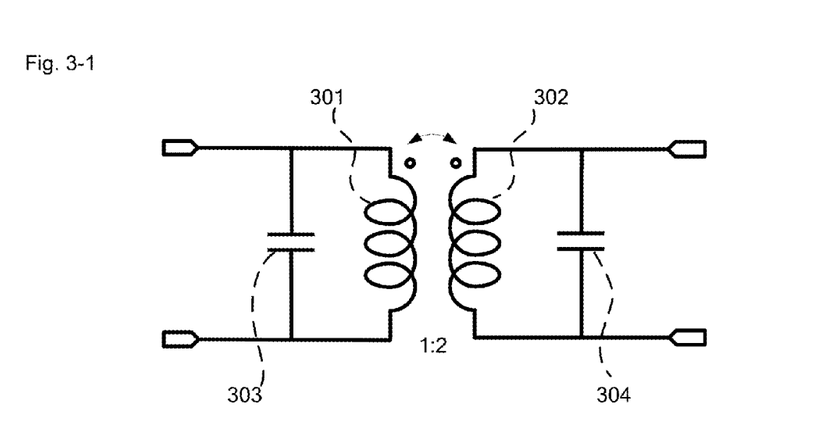

FIG. 3-1 is a diagram showing a structure of a four-port transformer circuit having a turns ratio of 1:2 in the related arts, the four-port transformer circuit is formed by combining a primary inductor 301 with a secondary inductor 302, wherein the turns ratio of the primary inductor 301 to the secondary inductor is 1:2, the primary inductor 301 is connected with a first primary tuning capacitor 303 in parallel, and the secondary inductor 302 is connected with a first secondary tuning capacitor 304 in parallel.

Figure 32:
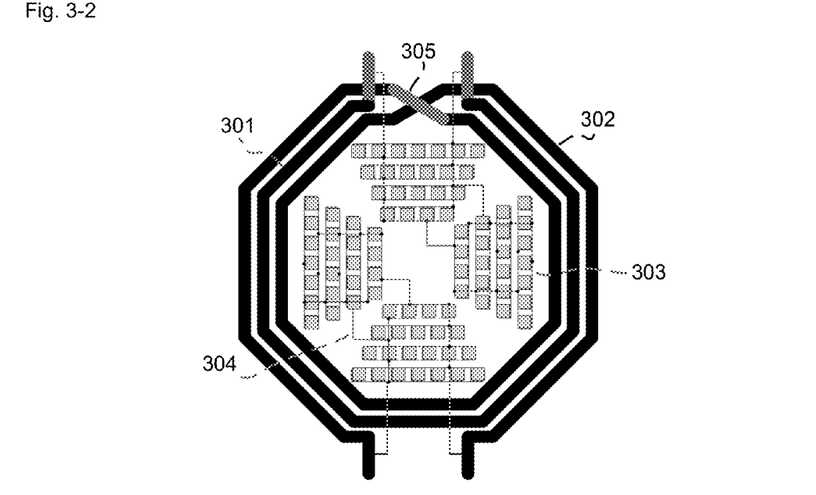

FIG. 3-2 is a diagram showing a layout implementation structure of FIG. 3-1 in an embodiment of the disclosure, as shown in FIG. 3-2, the primary coil 301 and the secondary coil 302 are mutually and symmetrically wound on a same substrate via the metal on the same layer, and an upper-layer metal or a lower-layer metal 305 is adopted for transition in the crossed part of the metal wires. The first primary tuning capacitor 303 and the first secondary tuning capacitor 304 are arranged below a central blank area enclosed by the primary coil 301 and the secondary coil 302, wherein the first primary tuning capacitor 303 and the first secondary tuning capacitor 304 are formed by connecting a lot of small capacitors with a small area in parallel, and the small capacitors serve as the second primary tuning capacitor and the second secondary tuning capacitor. The small capacitors and their wires form a partially-shielded network which is spread below the central area enclosed by the primary coil 301 and the secondary coil 302, so as to reduce the eddy current loss of the substrate. In addition, the area of each small capacitor is much smaller than the central blank area, so that the eddy current loss of the whole tuning capacitor network is very small, accordingly, the inductance Q values of the primary coil 301 and the secondary coil 302 of the transformer are improved.

Second Embodiment

Figure 41:
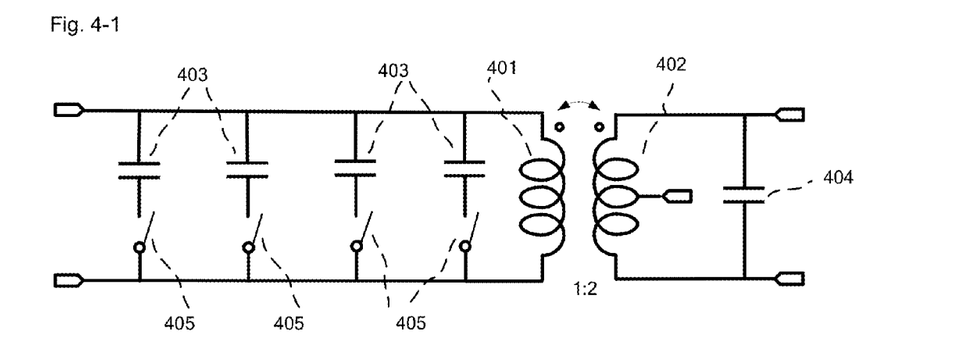

FIG. 4-1 is a diagram showing a structure of a four-port frequency-adjustable transformer-type balun circuit having a turns ratio of 1:2 in the related arts. The transformer-type balun circuit is formed by coupling one primary coil 401 with one secondary coil 402, and the turns ratio of the primary coil 401 to the secondary coil 402 is 1:2. The secondary coil 402 is connected with one first secondary tuning capacitor 404 in parallel, and the primary coil 401 is connected with four first primary tuning capacitors 403 in parallel, wherein the capacitances of the first primary tuning capacitors 403 can be different or the same, each first primary tuning capacitor 403 is connected with one switch 405 in series, and the value of the tuning capacitor which is connected with the primary coil 401 in parallel can be changed by the on/off of a control switch 405.

Figure 42:
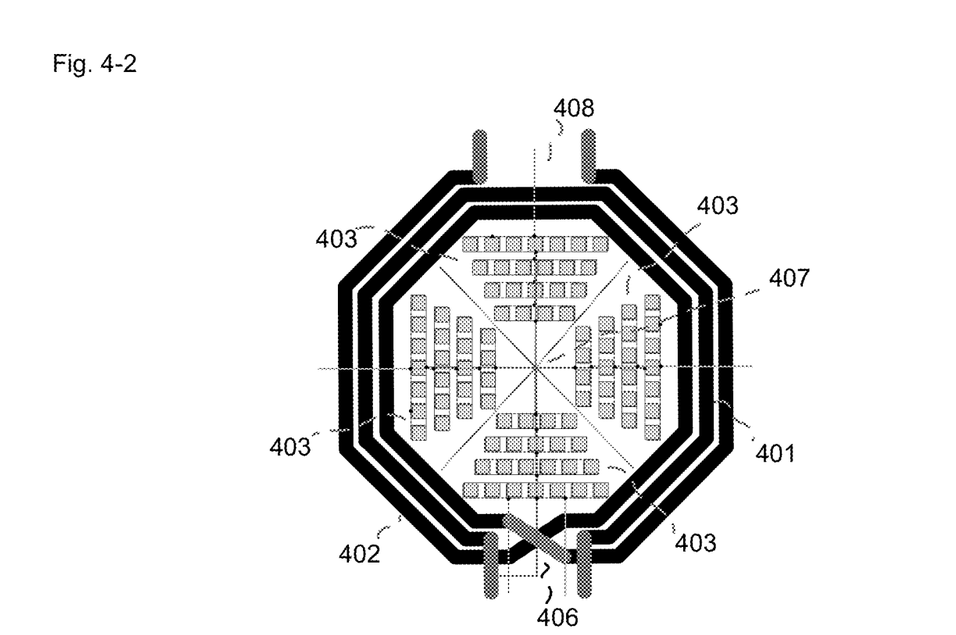

FIG. 4-2 is a diagram showing a layout implementation structure of FIG. 4-1 in an embodiment of the disclosure. As shown in FIG. 4-2, the turns ratio of the primary coil 401 to the secondary coil 402 is 1:2, and the primary coil 401 and the secondary coil 402 are mutually and symmetrically wound on a same substrate via the metal on the same layer, and an upper-layer metal or a lower-layer metal 406 is adopted for transition in the crossed part of the metal wires. The four first primary tuning capacitors 403 of the primary coil 401 are arranged below the central blank area enclosed by the primary coil 401 and the secondary coil 402. Each first primary tuning capacitor 403 consists of a plurality of small capacitors with a small area, the small capacitors serve as a second primary tuning capacitor, and the upper electrode plates of all the small capacitors are connected with a dual-cross-shaped partially-shielded network 407. The lower electrode plates of the four first primary tuning capacitors 403 are connected together and then are connected with an external switch of the transformer through a lower-layer metal wire 408 which is perpendicular to the metal wires of the primary coil 401 and the secondary coil 402. Each first secondary tuning capacitor 404 can be formed by connecting a plurality of small capacitors with a small area in parallel but is not arranged below the central blank area enclosed by the primary coil 401 and the secondary coil 402.

It should be noted that each first secondary tuning capacitor 404 may also be arranged in the central blank area enclosed by the primary coil 401 and the secondary coil 402; in the specific implementation process, whether the area of the central blank area is enough for the configuration of each first secondary tuning capacitor 404 is mainly considered; based on this, FIG. 4-2 is only a diagram showing a layout implementation structure of an adjustable transformer-type balun circuit shown in FIG. 4-1; and based on what described above, those skilled in the art can make a proper change for the diagram showing a layout implementation structure shown in FIG. 4-2.

Figure 43:
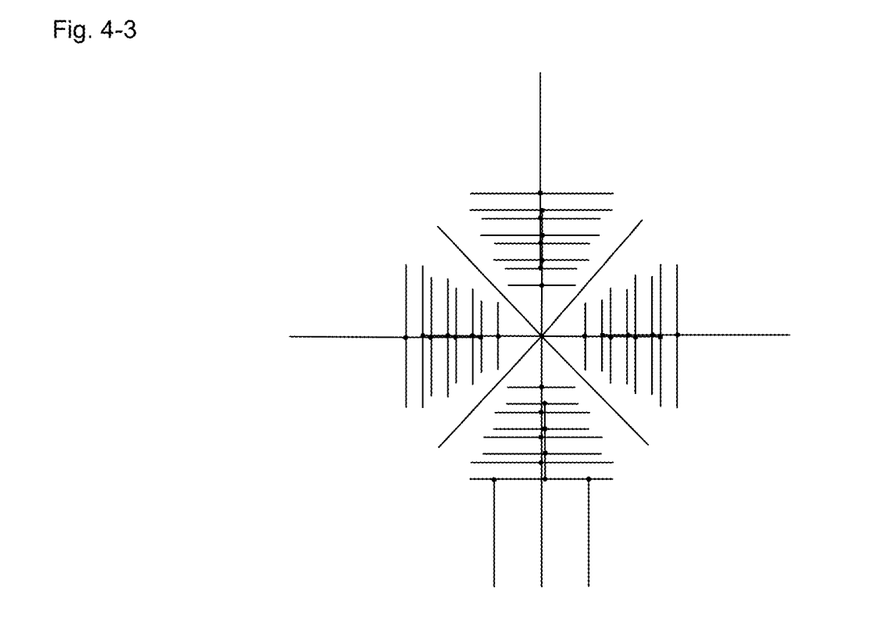

FIG. 4-3 is a diagram showing a network structure of interconnected metal wires after a tuning capacitor is removed from a partially-shielded network in FIG. 4-2. As shown in FIG. 4-3, the metal wires in the network do not form an annular loop of any shape, so that no eddy current loop passes through the wires. In addition, only a limited number of metal wires vertically pass through the bottom of a metal coil in the shielded network of metal interconnected wires, so that the parasitic capacitance between the coil and the shielded network is very small, and the self-resonant frequency of the inductor of the coil of the transformer is almost unchanged.

It should be understood that, the specific embodiments of the disclosure are described in details but cannot be regarded as a limit to the protection scope of the disclosure. Any simple inference and change shall fall within the scope of the disclosure, and the protection scope of the disclosure shall be subject to the claims.

INDUSTRIAL APPLICABILITY

In the embodiments of the disclosure, the first primary tuning capacitor and/or the first secondary tuning capacitor are/is arranged in an area enclosed by the primary coil and the secondary coil, wherein the first primary tuning capacitor includes more than one second primary tuning capacitor, and the first secondary tuning capacitor includes more than one second secondary tuning capacitor; the more than one second primary tuning capacitor are connected in parallel, and the more than one second secondary tuning capacitor are connected in parallel; and the more than one second primary tuning capacitor and their wire(s), and/or the more than one second secondary tuning capacitor and their wire(s) form a partially-shielded network or part of the partially-shielded network. Thus, the aims of improving the Q value of the inductor and reducing the area of the LC resonant network can be achieved.

What is claimed is:

1. A method for manufacturing a transformer, the transformer comprising a primary coil, a secondary coil, a first primary tuning capacitor and a first secondary tuning capacitor, and the method comprising:
arranging the first primary tuning capacitor and/or the first secondary tuning capacitor in an area enclosed by the primary coil and the secondary coil, the first primary tuning capacitor comprising more than one second primary tuning capacitor, and the first secondary tuning capacitor comprising more than one second secondary tuning capacitor;
connecting the more than one second primary tuning capacitor in parallel, and connecting the more than one second secondary tuning capacitor in parallel; and
forming a partially-shielded network or part of the partially-shielded network by the more than one second primary tuning capacitor and at least one wire between the more than one second primary tuning capacitor, and/or by the more than one second secondary tuning capacitor and at least one wire between the more than one second secondary tuning capacitor.

2. The method according to claim 1, wherein arranging the first primary tuning capacitor and/or the first secondary tuning capacitor in an area enclosed by the primary coil and the secondary coil comprises:
arranging all or some of the more than one second primary tuning capacitor and/or all or some of the more than one second secondary tuning capacitor in a blank area enclosed by the primary coil and the secondary coil or under the blank area.

3. The method according to claim 1, wherein the transformer comprises an on-chip passive transformer or an on-chip transformer-type balun.

4. The method according to claim 1, wherein capacitances of the more than one second primary tuning capacitor are completely or incompletely the same;
and/or, capacitances of the more than one second secondary tuning capacitor are completely or incompletely the same.

5. The method according to claim 1, further comprising:
winding the primary coil and the secondary coil mutually and symmetrically on a same substrate via a metal on a same layer, and adopting an upper-layer metal or a lower-layer metal for transition in a crossed part of metal wires.

6. A transformer, comprising: a primary coil, a secondary coil, a first primary tuning capacitor and a first secondary tuning capacitor, wherein the first primary tuning capacitor comprises more than one second primary tuning capacitor which are connected in parallel; and the first secondary tuning capacitor comprises more than one second secondary tuning capacitor which are connected in parallel;
the first primary tuning capacitor and/or the first secondary tuning capacitor are/is arranged in an area enclosed by the primary coil and the secondary coil; and the more than one second primary tuning capacitor and at least one wire between the more than one second primary tuning capacitor, and/or the more than one second secondary tuning capacitor and at least one wire between the more than one second secondary tuning capacitor form a partially-shielded network or part of a partially-shielded network.

7. The transformer according to claim 6, wherein the primary coil and the secondary coil are mutually and symmetrically wound on a same substrate via a metal on a same layer, and an upper-layer metal or a lower-layer metal is adopted for transition in a crossed part of metal wires.

8. The transformer according to claim 6, wherein all or some of the more than one second primary tuning capacitor and/or all or some of the more than one second primary tuning capacitor are arranged in a blank area enclosed by the primary coil and the secondary coil or under the blank area.

9. The transformer according to claim 6, wherein capacitances of the more than one second primary tuning capacitor are completely or incompletely the same;
and/or, capacitances of the more than one second secondary tuning capacitor are completely or incompletely the same.

10. A chip, comprising a transformer comprising a primary coil, a secondary coil, a first primary tuning capacitor and a first secondary tuning capacitor, wherein the first primary tuning capacitor comprises more than one second primary tuning capacitor which are connected in parallel; and the first secondary tuning capacitor comprises more than one second secondary tuning capacitor which are connected in parallel;
the first primary tuning capacitor and/or the first secondary tuning capacitor are/is arranged in an area enclosed by the primary coil and the secondary coil; and the more than one second primary tuning capacitor and at least one wire between the more than one second primary tuning capacitor, and/or the more than one second secondary tuning capacitor and at least one wire between the more than one second secondary tuning capacitor form a partially-shielded network or part of a partially-shielded network.

11. The method according to claim 2, further comprising:
winding the primary coil and the secondary coil mutually and symmetrically on a same substrate via a metal on a same layer, and adopting an upper-layer metal or a lower-layer metal for transition in a crossed part of metal wires.

12. The method according to claim 3, further comprising:
winding the primary coil and the secondary coil mutually and symmetrically on a same substrate via a metal on a same layer, and adopting an upper-layer metal or a lower-layer metal for transition in a crossed part of metal wires.

13. The method according to claim 4, further comprising:
winding the primary coil and the secondary coil mutually and symmetrically on a same substrate via a metal on a same layer, and adopting an upper-layer metal or a lower-layer metal for transition in a crossed part of metal wires.

14. The transformer according to claim 7, wherein capacitances of the more than one second primary tuning capacitor are completely or incompletely the same;
and/or, capacitances of the more than one second secondary tuning capacitor are completely or incompletely the same.

15. The transformer according to claim 8, wherein capacitances of the more than one second primary tuning capacitor are completely or incompletely the same;
and/or, capacitances of the more than one second secondary tuning capacitor are completely or incompletely the same.

16. The chip according to claim 10, wherein the primary coil and the secondary coil are mutually and symmetrically wound on a same substrate via a metal on a same layer, and an upper-layer metal or a lower-layer metal is adopted for transition in a crossed part of metal wires.

17. The chip according to claim 10, wherein all or some of the more than one second primary tuning capacitor and/or all or some of the more than one second primary tuning capacitor are arranged in a blank area enclosed by the primary coil and the secondary coil or under the blank area.

18. The chip according to claim 10, wherein capacitances of the more than one second primary tuning capacitor are completely or incompletely the same;
- and/or, capacitances of the more than one second secondary tuning capacitor are completely or incompletely the same.

19. The chip according to claim 16, wherein capacitances of the more than one second primary tuning capacitor are completely or incompletely the same;
- and/or, capacitances of the more than one second secondary tuning capacitor are completely or incompletely the same.

20. A chip according to claim 17, wherein capacitances of the more than one second primary tuning capacitor are completely or incompletely the same;
- and/or, capacitances of the more than one second secondary tuning capacitor are completely or incompletely the same.

\* \* \* \* \*